United States Patent [19]
Tempel et al.

[11] Patent Number: 5,883,832
[45] Date of Patent: Mar. 16, 1999

[54] ELECTRICALLY ERASABLE AND PROGRAMMABLE NON-VOLATILE STORAGE LOCATION

[75] Inventors: Georg Tempel; Josef Winnerl, both of München, Germany

[73] Assignee: Siemens Aktiengesellschaft, Munich, Germany

[21] Appl. No.: 983,290

[22] PCT Filed: Jul. 8, 1996

[86] PCT No.: PCT/DE96/01226

§ 371 Date: Jan. 9, 1998

§ 102(e) Date: Jan. 9, 1998

[87] PCT Pub. No.: WO97/04490

PCT Pub. Date: Feb. 6, 1997

[30] Foreign Application Priority Data

Jul. 17, 1995 [DE] Germany .................. 195 26 012.0

[51] Int. Cl.$^6$ .................................................. G11C 16/04
[52] U.S. Cl. ........................ 365/185.18; 365/185.29; 365/185.33; 365/218
[58] Field of Search .................. 365/185.18, 185.24, 365/185.29, 185.33, 218

[56] References Cited

U.S. PATENT DOCUMENTS

| | | | |
|---|---|---|---|
| 4,399,523 | 8/1983 | Gerber et al. | 365/218 |
| 4,613,885 | 9/1986 | Haken | 357/42 |
| 5,077,691 | 12/1991 | Hadadad et al. | 365/218 |
| 5,086,325 | 2/1992 | Schumann et al. | 357/235 |
| 5,191,551 | 3/1993 | Inoue | 365/185 |
| 5,294,819 | 3/1994 | Simko | 257/314 |
| 5,598,369 | 1/1997 | Chen et al. | 365/185.27 |

FOREIGN PATENT DOCUMENTS

| | | |
|---|---|---|
| 0 551 728 A3 | 7/1993 | European Pat. Off. . |
| 0 558 404 A2 | 9/1993 | European Pat. Off. . |
| 0 616 368 A2 | 9/1994 | European Pat. Off. . |
| 0 618 586 A1 | 10/1994 | European Pat. Off. . |
| 37 01 649 A1 | 8/1988 | Germany . |

OTHER PUBLICATIONS

Patent Abstracts Of Japan, vol. 15, No. 241 (E–1080), 21 Jun. 1991 and JP 03 74881 dated 29 Mar. 1991.

"A 5–V Only 16–Mb Flash Memory With Sector Erase Mode," by Toshikatsu Jinbo et al., IEEE Journal Of Solid State Circuits, vol. 27, No. 11, Nov. 1992, pp. 1547–1553.

"Two–Dimensional Numerical Analysis of Floating–Gate EEPROM Devices" by Ann Concannon et al, IEEE Transactions On Electron Devices, vol. 40, No. 7, Jul. 1993, pp. 1258–1262.

*Primary Examiner*—David Nelms
*Assistant Examiner*—Hien Nguyen
*Attorney, Agent, or Firm*—Hill & Simpson

[57] ABSTRACT

Electrically erasable and programmable non-volatile memory cell, which is formed with only one MOS transistor which is formed by a source-channel-drain junction, semi conductor substrate (1) of a first conductivity type has a drain region (2) and a source region (3) of a second conductivity type with a polarity opposite to that of the first conductivity type. A gate electrode (4), which is at a floating potential, is electrically insulated from the drain area (2) by a tunneling oxide (5) and from a channel region (9), which is located between the drain area and the source area (2, 3), by a gate oxide (5; 10). It and extends at least over a part of the channel region (9) and a part of the drain region (2) in the source-channel-drain direction. A control electrode (7) is electrically insulated from the gate electrode (4) by a coupling oxide (8).

7 Claims, 2 Drawing Sheets

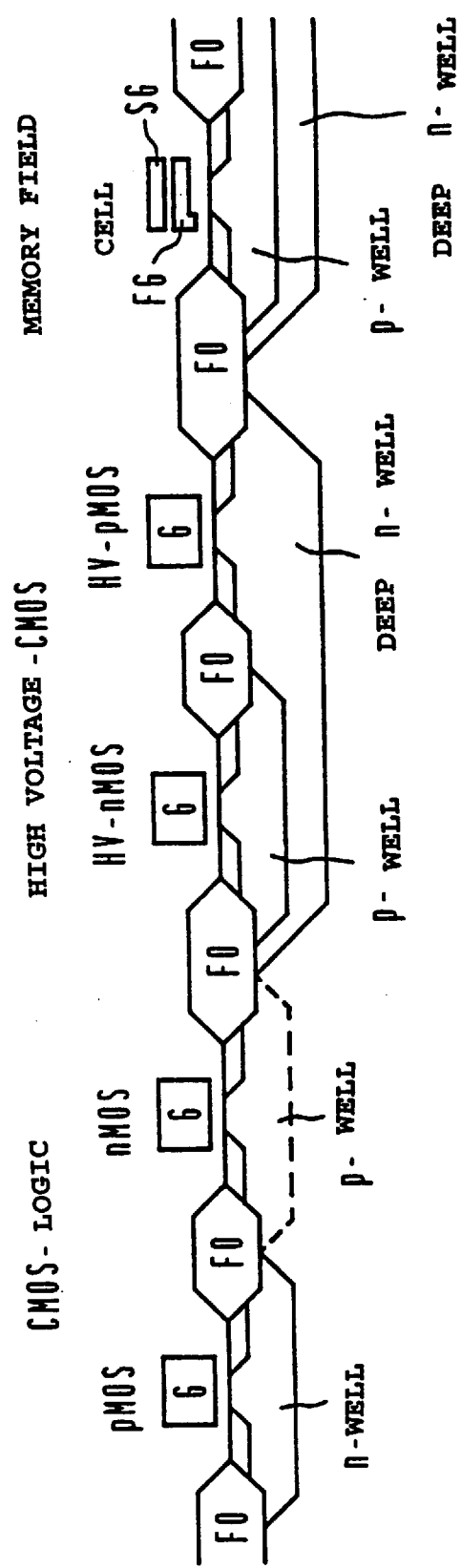

ELECTRICALLY ERASABLE AND PROGRAMMABLE NON-VOLATILE STORAGE LOCATION

BACKGROUND OF THE INVENTION

In applications for general control tasks, but in particular in smart cards, microcontrollers require non-volatile memories as program memories and data memories. Particularly when used in battery-operated portable data media, for example in the case of mobile data transmissions and data processing, or with wire-free power supply, for example in the case of contact-free smart cards, only programming and erasing methods having a low power consumption are acceptable, in particular for the data memory. In the same way, the supply voltages should be less than 3 V. Since controllers and smart cards are subjected to high pricing pressures, it is important for widespread use that the production process complexity for the non-volatile memories is low.

The FLOTOX-EEPROM cells which are widely used in smart cards nowadays, as are known for example from "Mikroelektronische Speicher" [Microelectronic memory] by Dietrich Rhein and Heinz Freitag, Springer Press, Vienna 1992, in particular on page 122, are distinguished by low power consumption since they are programmed and erased via Fowler-Nordheim tunnel currents. In consequence, the programming voltages can also easily be produced on the chip from low supply voltages, which may be less than 3 V. Such memories can be reprogrammed byte by byte so that FLOTOX-EEPROM cells are particularly suitable for data memories which are reprogrammed in operation. These FLOTOX-EEPROM cells comprise a selection transistor and a storage transistor and therefore require a large cell area, so that only small-memories can be implemented on a chip. In addition, as a result of the high required programming voltage of 15 to 20 V, the implementation of the high-voltage transistors to allow this programming voltage to be switched is costly.

In contrast to EEPROMs, flash memories are implemented with only one transistor per memory cell so that considerably more complex memories than with FLOTOX-EEPROM cells are possible here. However, they are programmed with hot charge carriers (channel hot electron: CHE). This type of programming requires high programming currents, which limit the minimal supply voltage to about 5 V. They cannot therefore be used as data memories, which are intended to be reprogrammed in operation from low supply voltages or via contact-free power supplies. A split-gate flash EEPROM cell which is usual nowadays, is likewise illustrated and described on page 126 of the book "Mikroelektronische Speicher" [Microelectronic Memories].

U.S. Pat. No. 5,294,819 also shows a one-transistor EEPROM cell, which is formed with only one MOS transistor, which is formed by a source-channel-drain junction in which there are constructed in a semiconductor substrate of a first conductivity type a drain region and a source region of a second conductivity type and having a polarity opposite to that of the first conductivity type. The cell has a gate electrode which is at a floating potential and is electrically insulated from the drain area by a tunneling oxide and from a channel region, which is located between the drain area and the source area, by a gate oxide, and extends at least over a part of the channel region and a part of the drain region in the source-channel-drain direction, and a control electrode which is electrically insulated from the gate electrode by a coupling oxide.

There, both erasing and programming are carried out by means of tunneling currents, although use is made only of a high positive voltage which is applied either to the control gate or to the drain terminal of the transistor, in order to bring electrons to the control gate or take them away. Owing to the use of only a high positive voltage, the latter must have a large absolute value of approximately 18 volts, resulting in the high outlay for insulation on the semiconductor chip.

Patent Abstracts of Japan, Vol. 15, No. 241 and Japanese reference JP-A-3,074,881 likewise show a non-volatile memory cell having the design described above. There, a negative voltage is applied to the control gate and a low voltage is applied to the drain electrode in order to remove electrodes from the memory gate. However, it is not disclosed how the electrons are brought to the memory gate.

SUMMARY OF THE INVENTION

It is thus the object of the present invention to specify a method for operating an electrically erasable and programmable non-volatile memory cell which avoids the disadvantages of the prior art.

In general terms, the present invention is a method for operating an electrically erasable and programmable non-volatile memory cell, which is formed with only one MOS transistor which is formed by a source-channel-drain junction.

There are constructed in a semiconductor substrate of a first conductivity type a drain region and a source region of a second conductivity type that has a polarity opposite to that of the first conductivity type.

A gate electrode is at a floating potential and is electrically insulated from the drain area by a tunneling oxide and from a channel region, which is located between the drain area and the source area, by a gate oxide. The gate electrode extends at least over a part of the channel region and a part of the drain region in the source-channel-drain direction.

A control electrode is electrically insulated from the gate electrode by a coupling oxide.

In order to program the memory cell, a high negative voltage is applied to the control electrode. The supply voltage is applied to the drain electrode (D) and zero volts are applied to the source electrode.

In order to erase the memory cell, a high positive voltage is applied to the control electrode, a negative voltage is applied to the source electrode, and the drain electrode is not connected.

Advantageous developments of the present invention are as follows.

The gate electrode of the memory cell extends over the entire channel region.

The oxide layer in the memory cell is divided over the channel region into a first gate oxide region, which couples the gate electrode capacitively to the channel region, and into a second gate oxide region. The second gate oxide region couples a subregion of the control electrode capacitively to the channel region.

The tunneling oxide in the memory cell is thinner than the gate oxide.

The gate oxide in the memory cell extends into the region of the junction between the drain area and the channel area, and partially overlaps the drain area.

The MOS transistor is constructed in a well of the first conductivity type, which well is arranged in a deep well of the second conductivity type.

The MOS transistor is arranged together with a standard CMOS logic circuit and/or a high-voltage circuit in a semiconductor substrate.

The memory cell on which the invention is based comprises only one transistor, so that its space requirement is considerably smaller than conventional FLOTOX-EEPROM cells. However, it is programmed and erased in the same manner as such FLOTOX-EEPROM cells, by Fowler-Nordheim tunnel currents.

However, as a result of use according to the invention of negative and positive voltages for programming and erasing, the magnitude of the high voltages can be kept relatively low, so that the non-high-voltage circuit parts need not be designed to withstand such high voltages, either, and they can thus be produced at a reduced manufacturing cost. In addition, the on-chip charging pump which is required to produce the high voltage may be of small size.

If the first conductivity type is the p-conductivity type and the MOS transistor which forms the cell is an n-channel transistor, the cell is typically programmed by applying a voltage of −12 V to its control gate and a voltage of +5 V to the drain, while the source is connected to earth. In consequence, in the region of the tunnelling oxide, that is to say in the region in which the gate electrode, the so-called floating gate which is at a floating potential, overlaps the drain region, charge carriers tunnel through the tunnelling oxide with the result that the floating gate is positively charged. In consequence, the threshold voltage of this MOS transistor is shifted to lower values. In order to erase a cell which has been programmed in such a manner, a voltage of typically 12 V is applied to the control electrode and a voltage of typically −6 V is applied to the source electrode, while the drain electrode remains open. In consequence, charge carriers tunnel between the floating gate and the source region as well as the channel region, so that the floating gate is discharged again and the threshold voltage of the transistor is shifted to higher values. The threshold voltages are about 1 V for a programmed cell and about 5 V for a cell which is not programmed. A voltage of about 3 V is therefore applied to the control gate for reading, while a voltage of about 1 V is applied to the drain, and a voltage of 0 V is applied to the source. A current will flow only in a programmed cell, and can be detected, for example, as logic "1".

As a result of the simultaneous use according to the invention of a positive voltage and a negative voltage for programming and erasing a memory cell according to the invention, it is possible to dispense with an additional selection transistor, which necessitates a high space requirement, and nevertheless to be able to address each memory cell individually. In the case of a conventional arrangement of the memory cells in a memory matrix, in which the gate connections of the memory cells are connected to the wordlines and the drain connections are connected to the bitlines, all the memory cells whose gate connections are connected to this wordline are necessarily connected to a negative voltage if said negative voltage is applied to a wordline. However, the only memory cell which is programmed is that whose drain connection is connected to a positive voltage. The condition that both voltages are applied simultaneously only to a single memory cell can thus be satisfied by selection of only one wordline and only one bitline.

In the case of the memory cell according to the invention, the supply voltage is present, as a maximum, at the drain connection so that the supply voltage is present, as a maximum, on the bitline which is connected to the drain connection and thus on the evaluation circuits, and there is therefore no need to take special precautions for protection of these evaluation circuits.

The memory cell according to the invention can be implemented in an advantageous manner together with standard CMOS logic circuits on a semiconductor substrate, that is to say on a chip. It is also possible to implement the high-voltage CMOS circuits, for switching the required positive and negative high voltages, on the same semiconductor substrate, at the same time as well. Both the memory cells and the high-voltage circuits are for this purpose arranged in deep wells having a polarity of the opposite conductivity type to the polarity of the conductivity type of the semiconductor substrate.

In a first configuration of a memory cell according to the invention, the floating gate extends in the source-channel-drain direction over the entire channel region as well as over a part of the drain region. This overlapping region of the floating gate and the drain in this case defines the tunnelling region during programming.

In a particularly advantageous configuration, the insulating oxide is thinner at least in a part of the overlapping region than over the channel region. The tunnelling region is now defined by this thinner region. However, in order to avoid gate-field-induced drain leakage, during programming, it is particularly advantageous for the oxide to be thicker in the region of the pn-junction from the drain region to the channel region than the tunnelling oxide.

In memory cells in which the floating gate covers the entire channel region, the threshold voltage of the cell becomes negative in the event of excessively long programming, so that deselection of such programmed cells during reading is prevented. This can be prevented by an advantageous configuration of a so-called split gate cell. In this case, the floating gate extends only over part of the channel region, while the control electrode extends over the entire channel region and, in doing so, is capacitively coupled to the channel, in order to control it, in the region where there is no longer any floating gate. With such a split gate cell, the lower threshold voltage of the cell is limited via the series transistor formed from a control electrode and the gate oxide, even when the threshold voltage of the transistor part composed of the floating gate and gate oxide becomes negative.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 4 shows the basic implementation, in schematic form, of the memory field, standard CMOS logic and high-voltage CMOS circuits in a semiconductor substrate.

DESCRIPTION OF THE PREFERRED EMBODIMENTS

Figure 1:
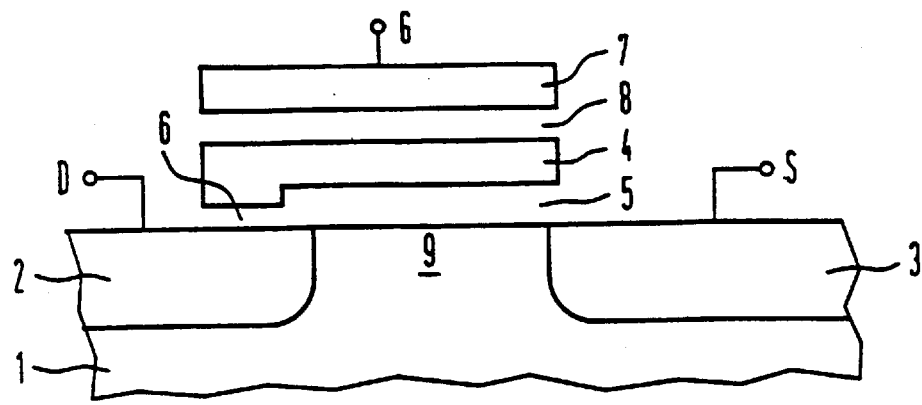
FIG. 1 shows a schematic illustration of a cross-section through a memory cell according to the invention.

FIG. 1 shows a semiconductor substrate 1 of a first conductivity type, which is intended to be of the p-type, for example. In this semiconductor substrate 1, a drain region 2 and a source region 3 of one conductivity type have the opposite polarity to the conductivity type of the semiconductor substrate 1, that is to say to the n-type in the present example. The transistor of this memory cell is correspondingly an n-channel transistor. The drain region 2 is provided with a drain connection D and the source region 3 is provided with a source connection S. An oxide layer is constructed as an electrical insulating layer over the drain region 2 and the source region 3, and the channel region 9 which is located between these regions. A gate electrode 4, which is at an electrically floating potential, is constructed over this oxide layer 5, 6. This is normally called a floating gate. It extends in the manner according to the invention in the source-channel-drain direction of the MOS transistor over the channel region and at least a part of the drain region 2. The region of the oxide layer between the floating gate 4 and the channel region is called the gate oxide 5, and the region of the oxide layer between the floating gate 4 and the drain region 2 is called the tunnelling oxide 6. In the case of the development of the invention illustrated in FIG. 1, the tunnelling oxide 6 is thinner than the gate oxide S. It is particularly advantageous if the tunnelling oxide 6, as is illustrated in FIG. 1, has the same thickness in the region of the pn-junction from the drain area 2 to the channel area 9 as the gate oxide 5, as the result of which any gate-field-induced drain leakage current is prevented or at least reduced. For applications in which a higher drain leakage current of this type can be accepted during programming, the arrangement in FIG. 1 can be simplified in that the thicknesses of the tunnelling oxide 6 and of the gate oxide 5 are selected to be the same. A number of process steps are omitted in the production method for this simplified memory cell. A control electrode 7 is arranged above the gate electrode and the floating gate 4 and is electrically insulated from the floating gate 4 by a coupling oxide 8. This control electrode 7 is connected to the gate connecting G.

Figure 2:
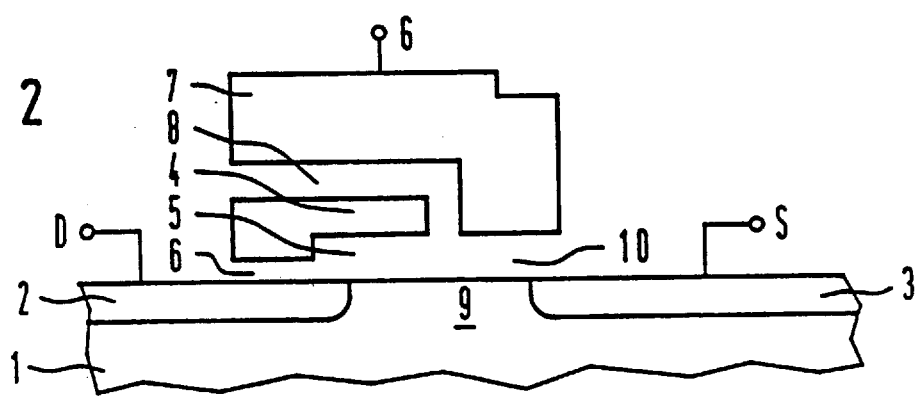
FIG. 2 shows a schematic illustration of a cross-section through a development of the memory cell according to the invention.

FIG. 2 shows a development of the memory cell according to FIG. 1, identical parts having the same reference numbers. A split gate cell is illustrated. In this case, the floating gate 4 extends only over part of the channel region 9. In consequence, the control electrode 7 can be capacitively coupled to the channel region 9 over a subregion 10 of the gate oxide, and can in consequence control this channel region 9. This measure compensates for the effects of the negative threshold voltage during "reprogramming".

Figure 3:
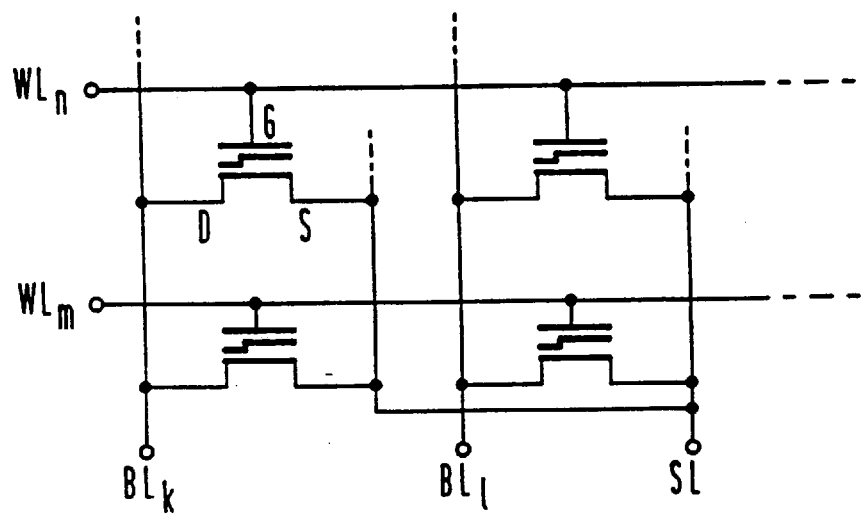
FIG. 3 shows a schematic illustration of the arrangement of such memory cells in a memory cell matrix.

FIG. 3 shows a schematic illustration of memory cells according to the invention in a memory cell matrix. The memory cell matrix is organized in the form of wordlines . . . $WL_n, WL_m$ . . . and bitlines . . . $BL_k, BL_l$ . . . The memory cells are each connected by their gate connection G to one of the wordlines . . . $WL_n, WL_m$ . . . , and by their drain connection D to one of the bitlines . . . $BL_k, BL_l$ . . . The source connections S of all the memory cells are connected to a source line SL. There may, of course, also be a plurality of source lines, which are then each connected to only one group of memory cell source connections S.

In the case of a memory cell which is formed using an NMOS transistor, it is necessary for programming purposes to apply a high negative programming voltage to the control electrode, that is to say to the gate connection G of the memory cell. According to FIG. 3, this means that this programming voltage must be applied to a wordline $WL_n$. However, this means that this programming voltage is simultaneously applied to all the other memory cells whose gate connections are connected to this wordline.

However, in order that programming actually takes place in the case of a memory cell according to the invention, a positive voltage must be applied to the drain connection D at the same time that the high negative programming voltage is applied to the gate connection G. As can once again be seen from FIG. 3, this positive voltage must be applied to a bitline $BL_k$, as a result of which this positive voltage is in turn applied to all the drain connections D of the memory cells which are connected to this bitline $BL_k$. However, programming takes place only-when simultaneously a negative programming voltage is present at the gate connection and a positive voltage is present at the drain connection. If only one wordline and only one bitline have been selected, this condition is satisfied only for a single memory cell. Thus, in the case of a memory constructed with memory cells according to the invention, each memory cell can be addressed individually. It is, of course, also possible to program a plurality of memory cells simultaneously by addressing a plurality of wordlines and/or a plurality of bitlines simultaneously.

A high positive voltage must be applied to the gate connection of a memory cell, and a negative voltage to the source connection, for erasing. If all the source connections are connected to a source line, and when only one wordline is selected, on which the high positive voltage is present, the smallest number of memory cells which are erased in one go is the number of memory cells which are connected to a wordline. This measure considerably speeds up the erasure process.

In the case of the implementation of the electrically erasable and programmable non-volatile memory described above, together with CMOS logic, special precautions have to be taken in particular because of the high positive and negative voltages which arise. The precautions are illustrated in a schematic manner in FIG. 4. Assuming a p-conductivity semiconductor substrate, the NMOS and PMOS field-effect transistors for the logic are produced in the p-substrate in an n-well. In consequence, the CMOS logic is design-compatible with standard CMOS circuits. A thicker gate oxide is necessary for the high voltage CMOS transistors and, in addition, the NMOS transistors for switching negative voltages are placed, insulated from the substrate, in a p-well within a deep n-well. The high-voltage PMOS transistors are located in the n-well. If the requirements placed on the switching speed of the logic are not severe, the high-voltage and logic transistors can also be implemented using the same (thicker) oxide thickness. The memory cells are produced, insulated from the substrate, in a p-well within a deep n-well. It is thus possible to connect a negative voltage to the common source line without influencing the logic section.

The use of positive and negative voltages limits the magnitude of the programming voltages which occur to about 12 V, so that the high-voltage sections may be designed only for this magnitude. As a result of the use of the insulated p-well within the deep n-well, negative voltages can be processed without having to revert to voltage invertors and PMOS source followers in the high-voltage section. In the memory cell field, the insulated p-well has the advantage that the common source line can be connected to a negative voltage without influencing the CMOS logic section. The positive and negative programming voltages can easily be produced on the chip by charging pumps, as a result of the low power consumption of the Fowler-Nordheim programming.

The individual components in FIG. 4 are isolated from one another by field-oxide regions FO. The gate electrodes G of the CMOS logic circuits and of the high-voltage CMOS circuits are admittedly illustrated at the same distance from the channel region in FIG. 4, but, in practice, if fast CMOS logic is required, the oxide thicknesses under the gate electrodes G are selected to be different. The floating gate FG and the control gate SG are illustrated in a schematic manner in the cell of the memory field illustrated in FIG. 4.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for operating an electrically erasable and programmable non-volatile memory cell, which is formed with only one MOS transistor which is formed by a source-channel-drain junction, comprising the steps of:

constructing in a semiconductor substrate of a first conductivity type, a drain region and a source region of a second conductivity type having a polarity opposite to that of the first conductivity type:

constructing a gate electrode which is at a floating potential, and which is electrically insulated from the drain area by a tunneling oxide and from a channel region, which is located between the drain area and the source area, by a gate oxide, and extends at least over a part of the channel region and a part of the drain region in a source-channel-drain direction;

constructing a control electrode which is electrically insulated from the gate electrode by a coupling oxide;

applying, for programming the memory cell, a high negative voltage to the control electrode, a supply voltage to the drain electrode and zero volts to the source electrode; and applying, for erasing the memory cell, a high positive voltage to the control electrode, a negative voltage to the source electrode, and disconnecting the drain electrode.

2. The method according to claim 1, wherein the gate electrode of the memory cell extends over the entire channel region (9).

3. The method according to claim 1, wherein an oxide layer in the memory cell is divided over the channel region into a first gate oxide region, which capacitively couples the gate electrode to the channel region, and into a second gate oxide region, the second gate oxide region capacitively coupling a subregion of the control electrode to the channel region.

4. The method according to claim 1, wherein the tunneling oxide in the memory cell is thinner than the gate oxide.

5. The method according to claim 4, wherein the gate oxide in the memory cell extends into a region of a junction between the drain area and the channel area, and partially overlaps the drain area.

6. The method according to claim 1, wherein the MOS transistor is constructed in a well of the first conductivity type, which well is arranged in a deep well of the second conductivity type.

7. The method according to claim 6, wherein the MOS transistor is arranged together with at least one of a standard CMOS logic circuit and a high-voltage circuit in a semiconductor substrate.

* * * * *